(12) United States Patent
Liu et al.

(10) Patent No.: US 10,141,306 B2
(45) Date of Patent: Nov. 27, 2018

(54) SYSTEMS, METHODS, AND APPARATUS FOR IMPROVED FINFETS

(71) Applicant: QUALCOMM Incorporated, San Diego, CA (US)

(72) Inventors: Yanxiang Liu, Glenville, NY (US); Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/418,651

(22) Filed: Jan. 27, 2017

(65) Prior Publication Data
US 2018/0219009 A1    Aug. 2, 2018

(51) Int. Cl.
| | |
|---|---|
| *H01L 29/78* | (2006.01) |
| *H01L 21/762* | (2006.01) |
| *H01L 21/8234* | (2006.01) |
| *H01L 21/3115* | (2006.01) |
| *H01L 27/088* | (2006.01) |
| *H01L 29/06* | (2006.01) |
| *H01L 21/308* | (2006.01) |
| *H01L 21/306* | (2006.01) |
| *H01L 29/66* | (2006.01) |

(52) U.S. Cl.
CPC ...... *H01L 27/0886* (2013.01); *H01L 21/3081* (2013.01); *H01L 21/30604* (2013.01); *H01L 21/31155* (2013.01); *H01L 21/76224* (2013.01); *H01L 21/823418* (2013.01); *H01L 21/823431* (2013.01); *H01L 21/823437* (2013.01); *H01L 21/823481* (2013.01); *H01L 29/0649* (2013.01); *H01L 29/66795* (2013.01); *H01L 29/785* (2013.01)

(58) Field of Classification Search
CPC ............ H01L 29/785–29/7858; H01L 21/76224–21/76237; H01L 21/823431; H01L 21/823821; H01L 21/845; H01L 27/0886; H01L 27/0924; H01L 27/10826; H01L 27/10879; H01L 27/1211; H01L 29/66795–29/66818; H01L 2029/7857–2029/7858
See application file for complete search history.

(56) References Cited

U.S. PATENT DOCUMENTS

| | | | |
|---|---|---|---|
| 7,118,987 B2 | 10/2006 | Fu et al. | |
| 7,960,286 B2 | 6/2011 | Liao et al. | |
| 8,319,311 B2 * | 11/2012 | Chen | ................ H01L 21/76232 257/510 |

(Continued)

OTHER PUBLICATIONS

International Search Report and Written Opinion—PCT/US2018/012025—ISA/EPO—dated Apr. 6, 2018.

*Primary Examiner* — Daniel P Shook
(74) *Attorney, Agent, or Firm* — Muncy, Geissler, Olds & Lowe, P.C.

(57) ABSTRACT

To avoid the problems associated with low density spin on dielectrics, some examples of the disclosure include a finFET with an oxide material having different densities. For example, one such finFET may include an oxide material located in a gap between adjacent fins, the oxide material directly contacts the adjacent fins of the plurality of fins with a first density proximate to a top layer of the oxide material and a second density proximate to a bottom layer of the oxide material and wherein the first density is greater than the second density.

17 Claims, 7 Drawing Sheets

(56) References Cited

U.S. PATENT DOCUMENTS

| | | |
|---|---|---|
| 9,691,766 B1 | 6/2017 | Lin et al. |
| 2013/0221491 A1 | 8/2013 | Wann et al. |
| 2014/0159126 A1 | 6/2014 | Wei et al. |
| 2014/0231919 A1 | 8/2014 | Peng et al. |
| 2015/0069474 A1* | 3/2015 | Ching ................ H01L 29/7842 257/288 |
| 2015/0123211 A1 | 5/2015 | Zhang et al. |
| 2015/0200127 A1 | 7/2015 | Chuang et al. |
| 2016/0118500 A1 | 4/2016 | Wu et al. |
| 2017/0025535 A1 | 1/2017 | Wu et al. |
| 2017/0110379 A1 | 4/2017 | Lin et al. |

* cited by examiner

SYSTEMS, METHODS, AND APPARATUS FOR IMPROVED FINFETS

FIELD OF DISCLOSURE

This disclosure relates generally to fin Field Effect Transistors (finFETs) and more specifically, but not exclusively, to finFETs with multi-layered shallow trench isolation regions.

BACKGROUND

Shallow trench isolation and the scaling of isolation with transistor size is an issue for conventional transistor manufacturing. Shallow trench isolation (STI) is an integrated circuit feature which prevents electric current leakage between adjacent semiconductor device components. STI is generally used on CMOS process technology nodes of 250 nanometers and smaller. STI is created early during the semiconductor device fabrication process, before transistors are formed. The key steps of the STI process involve etching a pattern of trenches in the silicon, depositing one or more dielectric materials (such as silicon dioxide) to fill the trenches, and removing the excess dielectric using a technique such as chemical-mechanical planarization.

In conventional manufacturing of transistors such as finFETs, a spin on dielectric (SOD) or flowable oxide is used to fill the gaps between fins of a finFET due to the filling capability into the high aspect ratio trench. Spin-on organic polymeric dielectrics are generally polymeric dielectrics that are deposited by a spin-on approach, such as those traditionally used to deposit photoresist, rather than chemical vapor deposition. Integration difficulties include low mechanical strength and thermal stability. Some examples of spin-on organic polymers are polyimide, polynorbornenes, benzocyclobutene, and PTFE. However, this SOD material is not very dense. For example, during curing the degasing of the SOD material leave holes or voids inside the STI oxide. Those holes or weak spots lead to finFET yield issues by causing gate to source/drain shorts.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a finFET comprises: a plurality of fins separated from each other to form a plurality of gaps between adjacent fins of the plurality of fins; an oxide material located in the plurality of gaps, the oxide material directly contacts the adjacent fins of the plurality of fins with a first density proximate to a top layer of the oxide material and a second density proximate to a bottom layer of the oxide material; and wherein the first density is greater than the second density.

In another aspect, a finFET comprises: a silicon substrate; a plurality of fins on a surface of the silicon substrate; an oxide material on the surface of the silicon substrate, the oxide material located between each of the plurality of fins; and a plurality of gate structures, each of the plurality of gate structures located on the oxide material and surrounding a respective one of the plurality of fins.

In still another aspect, a finFET comprises: a first means for conducting current; a second means for conducting current separated from the first means for conducting current to form a gap between the first means for conducting current and the second means for conducting current; means for isolation located in the gap and on each side of both the first means for conducting current and the second means for conducting current, the means for isolation directly contacts the first means for conducting current and the second means for conducting current with a first density proximate to a top layer of the means for isolation and a second density proximate to a bottom layer of the means for isolation; and wherein the first density is greater than the second density.

In still another aspect, a method for forming a finFET comprises: applying a mask to a silicon material; etching a plurality of fins in the silicon material to form a plurality of gaps between adjacent fins of the plurality of fins; filling the plurality of gaps with a fluid oxide; curing the fluid oxide to expose a portion of each of the plurality of fins; implanting an ion at a low energy to increase a density of a top layer of the cured oxide; and removing the mask.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
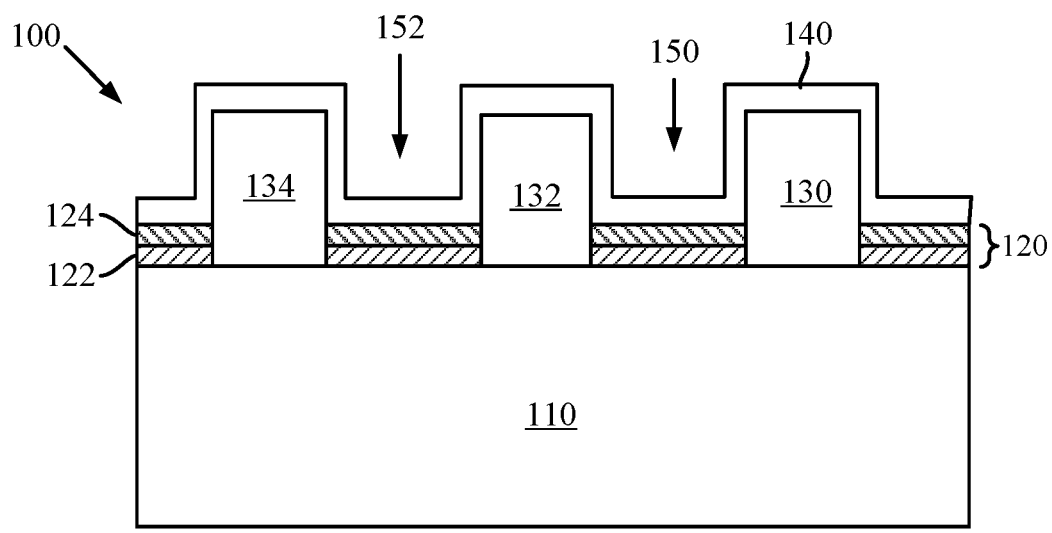
FIGS. 1A and B illustrate a side and a partial perspective view of a finFET in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. For example, a finFET may include an oxide material that has been implanted with ions to create an STI layer with multiple densities. By increasing the density of a top layer of the STI region, a finFET incorporating the multi-density STI layer may avoid the problems associated with using a spin on dielectric for the STI region.

Figure 1B:
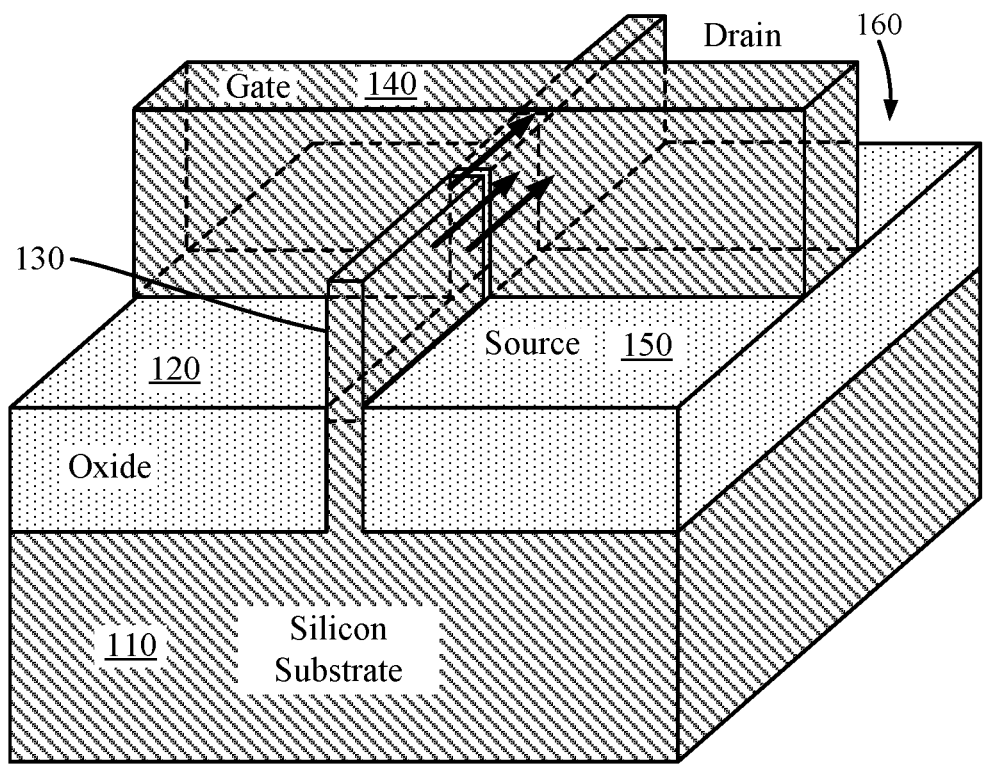

FIGS. 1A and B illustrate a side and perspective view of a finFET in accordance with some examples of the disclosure. As shown in FIG. 1A, a finFET 100 may include a silicon substrate 110 (e.g. a semiconductor substrate), an oxide material 120 (e.g. silicon dioxide) on a top side of the silicon substrate 110, a plurality of fins on the top layer of the silicon substrate 110 including a first fin 130, a second fin 132, and a third fin 134, a plurality of gate structures on the oxide material 120 including a first gate 140 and a plurality of gaps between adjacent fins including a first gap 150 and a second gap 152. The first gate 140 may surround the first fin 130. While FIG. 1A shows one gate over multiple fins, it should be understood that the finFET 100 may include multiple gates and fins (not shown) perpendicular to each other in a cross-hatch configuration. The first gap 150 may be located between the first fin 130 and the second fin 132. The second gap 152 may be located between the second fin 132 and the third fin 134. While FIG. 1A shows a first gap 150 and a second gap 152, it should be understood that the first gate 140 may extend across the first fin 130, the second fin 132, and the third fin 134 such that the first gap 150 and the second gap 152 are filled with the first gate 140 material. The oxide material 120 may have a bottom layer 122 with a second density and a top layer 124 with a first density such that the first density is greater than the second density. The difference in densities may be a result of different ion concentrations in the top layer 124 and the bottom layer 122. The ions may be silicon ions, carbon ions, nitrogen ions, fluorine ions, helium ions, or similar. These ions may be injected or implanted at low energies as discussed in more detail below with reference to FIGS. 3A-F. FIG. 1B shows a partial perspective view of the finFET 100. As shown in FIG. 1B, the finFET 100 may include a silicon substrate 110, an oxide material 120 on a top side of the silicon substrate 110, a first fin 130, a first gate 140, a source 150 on one side of the first gate 140, and a drain 160 on an opposite side of the first gate 140. While FIG. 1B shows one gate over one fin, it should be understood that the finFET 100 may include multiple gates and fins (not shown) perpendicular to each other in a cross-hatch configuration.

Figure 2:
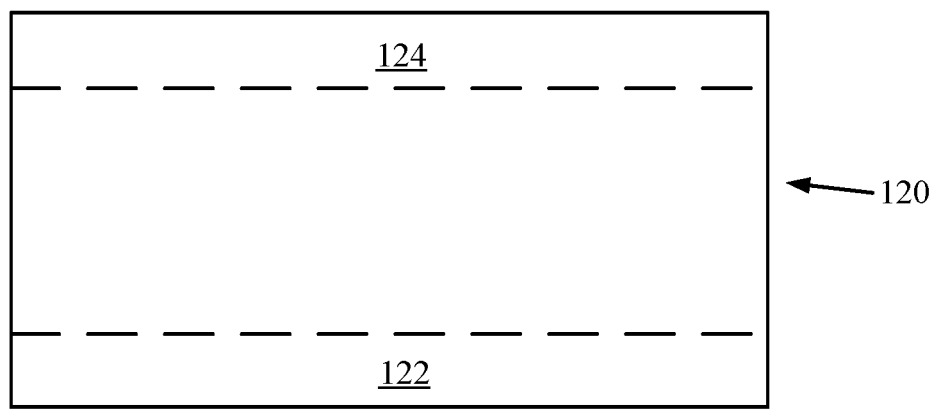
FIG. 2 illustrates a side view of an oxide material for using with a finFET in accordance with some examples of the disclosure.
Figure 3A:
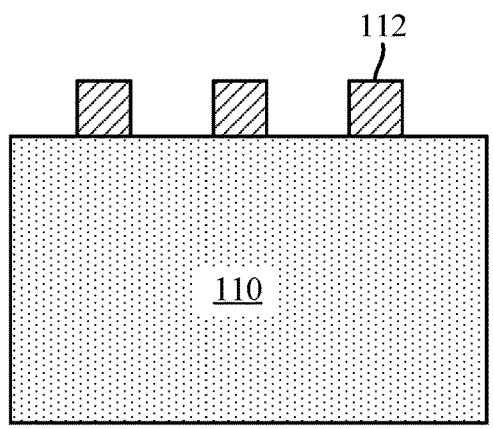
FIGS. 3A-F illustrate a partial method for manufacturing a finFET in accordance with some examples of the disclosure.
Figure 3B:
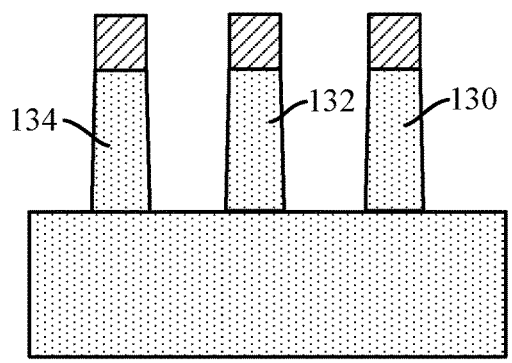
Figure 3C:
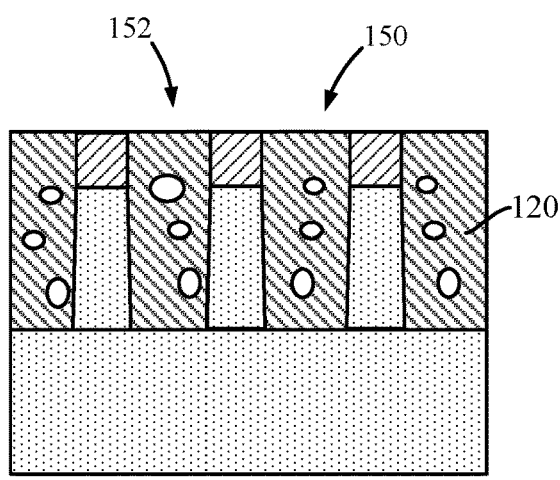
Figure 3D:
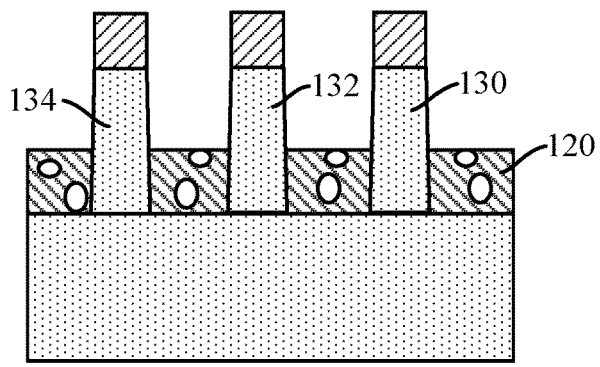

FIG. 2 illustrates a side view of an oxide material 120 for using with a finFET 100 in accordance with some examples of the disclosure. As shown in FIG. 2, the oxide material 120 may include a top layer 124 that has an ion concentration greater than a bottom layer 122. The different ion concentrations of the top layer 124 and the bottom layer 122 may give rise to different densities as well, such that the top layer 124 has a greater density than the bottom layer 122. The differences in density may be the result of a degassing process that occurs after ion implantation during a curing stage of the oxide material 120. For example, if the oxide material 120 is a silicon dioxide that is implanted by a room temperature or hot implant process that implants ions, such as silicon ions, carbon ions, nitrogen ions, fluorine ions, helium ions, or similar, at a low energy; then the ions may not travel completely from the top layer 124 to the bottom layer 122. This may result in a higher ion concentration at the top layer 124 than at the bottom layer 122. The higher ion concentration at the top layer 124 may prevent degassing of the top layer 124 during a curing stage of the oxide material 120. In effect, less degassing would take place at top layer 124 due to the higher ion concentration and gradually increases as you move towards the bottom layer 122. This may result in the top layer 124 have a higher density than the bottom layer 122. This process will be described in more detail below with reference to FIGS. 3A-F FIGS. 3A-F illustrate a partial method for manufacturing a finFET in accordance with some examples of the disclosure. As shown in FIG. 3A, the partial method begins with applying a mask 112 (e.g. a silicon nitride hardmask) to a silicon substrate 110 and patterning the mask 112 such that the mask 112 only remains at locations where a fin will be created. As shown in FIG. 3B, the partial method continues with etching a first fin 130, a second fin 132, and a third fin 134. As shown in FIG. 3C, the partial method continues with filling a first gap 150, a second gap 152, and the areas around the first fin 130, the second fin 132, and the third fin 134 with an oxide material 120. As shown in FIG. 3D, the partial method continues with recessing the oxide material 120 to create a STI layer around each of the first fin 130, the second fin 132, and the third fin 134.

Figure 3E:
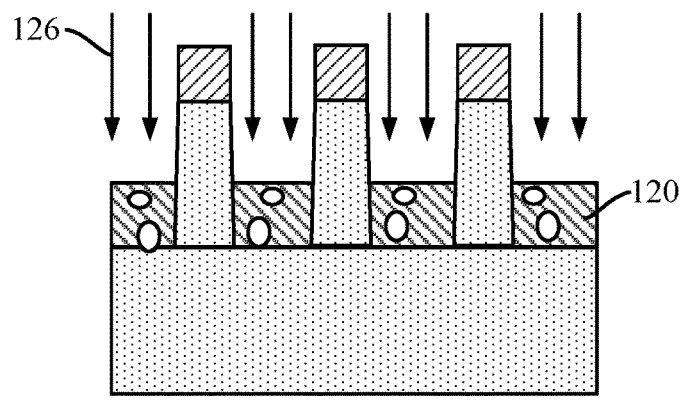

As shown in FIG. 3E, the partial method continues with implanting ions 126 at room temperature or a hot temperature such as 150 degree Celsius. Ion implantation is a materials engineering process by which ions of a material are accelerated in an electrical field and impacted into a solid. This process is used to change the physical, chemical, or electrical properties of the solid. The ions alter the elemental composition of the target (if the ions differ in composition from the target), stopping in the target and staying there. They also cause many chemical and physical changes in the target by transferring their energy and momentum to the electrons and atomic nuclei of the target material. This causes a structural change, in that the crystal structure of the target can be damaged or even destroyed by the energetic collision cascades. The ions used may be silicon ions, carbon ions, nitrogen ions, fluorine ions, helium ions, or similar.

Figure 3F:
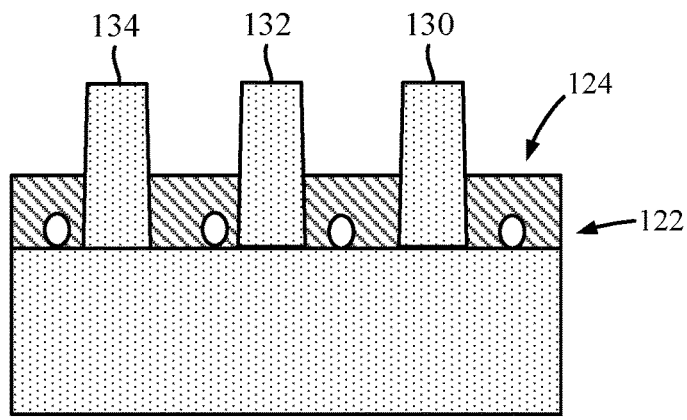

This creates different densities in the oxide material 120 from the top layer 124 to the bottom layer 122 based on how far and how much the ions penetrate the oxide material 120. The rate of penetration is based on the energy levels used during the implantation process. However, the energetic ions from implants can cause crystalline damage to the fin and increase junction leakage and fin parasitic resistance. With continuous scaling of FinFET technology, the fin width decreases in each technology node. The smaller fins become more prone to damage by ion implant. Thus, a low implant angle and low implant energy of 10 to 200 keV, for example, may avoid fin damage while allowing a desirable penetration rate of the oxide material 120. As shown in FIG. 3F, the partial method concludes with the removal of the mask 112 leaving a first fin 130, a second fin 132, and a third fin 134 with oxide layer 120 having a higher density in a top layer 124 than in the bottom layer 122.

Figure 4A:
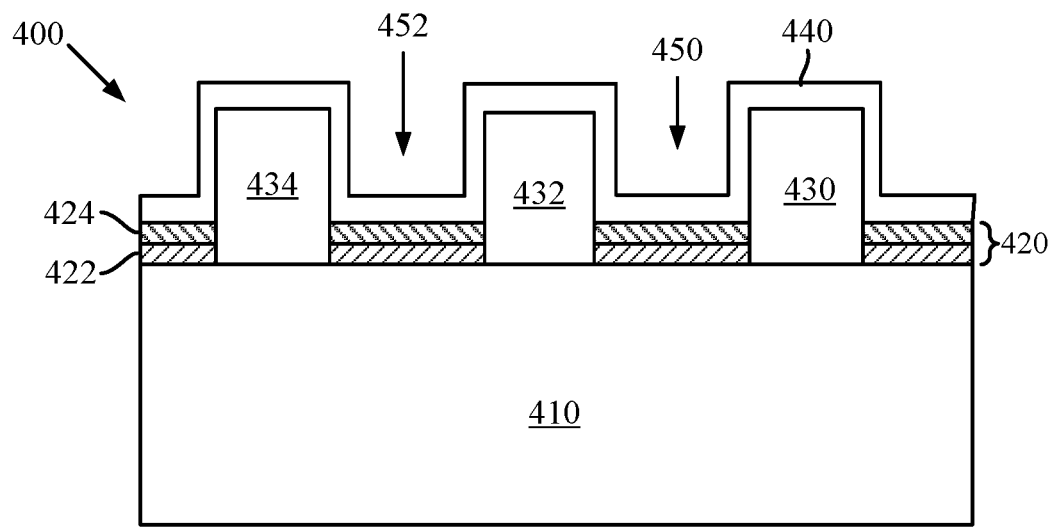
FIGS. 4A and B illustrate a side and a partial perspective view of a finFET in accordance with some examples of the disclosure.
Figure 4B:
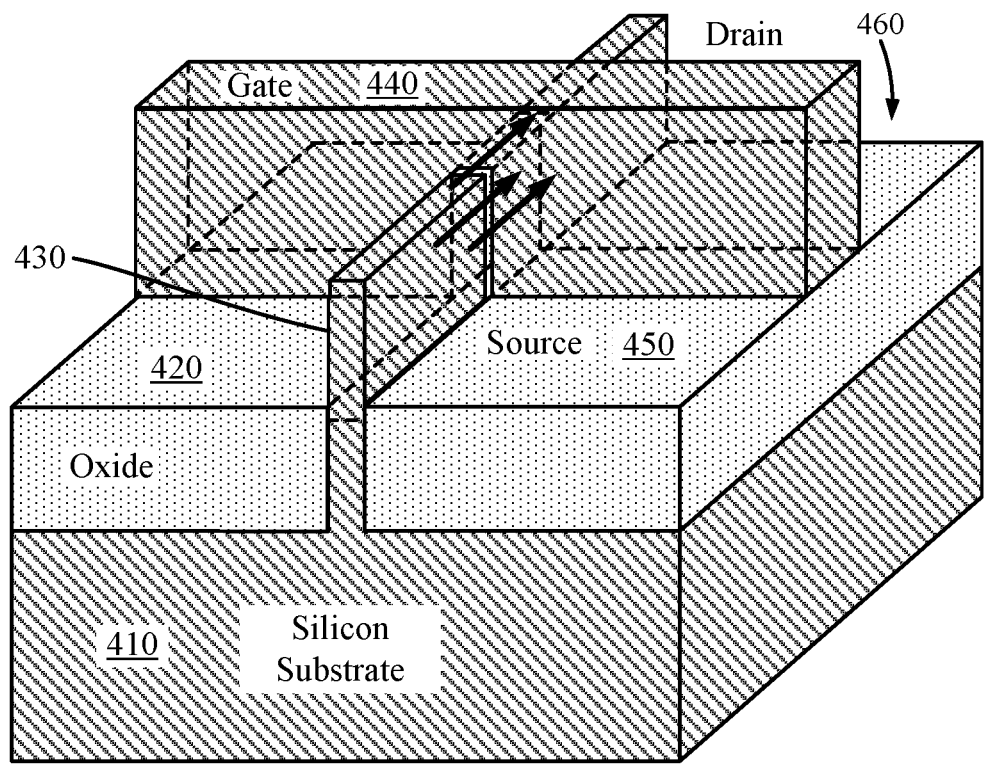

FIGS. 4A and B illustrate a side and perspective view of a finFET in accordance with some examples of the disclosure. As shown in FIG. 4A, a finFET 400 may include a silicon substrate 410 (e.g. a silicon substrate 110), means for isolation 420 (e.g. oxide material 120) on a top side of the silicon substrate 410, a plurality of means for conducting current on the top layer of the silicon substrate 410 including a first means for conducting current 430, a second means for conducting current 432, and a third means for conducting current 434, a plurality of gate structures on the means for isolation 420 including a first gate 440 and a plurality of gaps between adjacent fins including a first gap 450 and a second gap 452. The first gate 440 may surround the first means for conducting current 430. While FIG. 4A shows one gate over multiple fins, it should be understood that the finFET 400 may include multiple gates and fins (not shown) perpendicular to each other is a cross-hatch configuration. The first gap 450 may be located between the first means for conducting current 430 and the second means for conducting current 432. The second gap 452 may be located between the second means for conducting current 432 and the third means for conducting current 434. While FIG. 4A shows a first gap 450 and a second gap 452, it should be understood that the first gate 440 may extend across the first means for conducting current 430, the second means for conducting current 432, and the third means for conducting current 434 such that the first gap 450 and the second gap 452 are filled with the first gate 440 material. The first gap 450 may be located between the first means for conducting current 430 and the second means for conducting current 432. The second gap 452 may be located between the second means for conducting current 432 and the third means for conducting current 434. The means for isolation 420 may have a bottom layer 422 with a second density and a top layer 424 with a first density such that the first density is greater than the second density. The difference in densities may be a result of different ion concentrations in the top layer 424 and the bottom layer 422. The ions may be silicon ions, carbon ions, nitrogen ions, fluorine ions, helium ions, or similar. These ions may be injected or implanted at low energies as discussed in more detail above with reference to FIGS. 3A-F. FIG. 4B shows a perspective view of the finFET 400. As shown in FIG. 4B, the finFET 400 may include a silicon substrate 410, an means for isolation 420 on a top side of the silicon substrate 410, a first means for conducting current 430, a first gate 440, a source 450 on one side of the first gate 440, and a drain 460 on an opposite side of the first gate 440. While FIG. 4B shows one gate over one fin, it should be understood that the finFET 400 may include multiple gates and fins (not shown) perpendicular to each other in a cross-hatch configuration.

Figure 5:
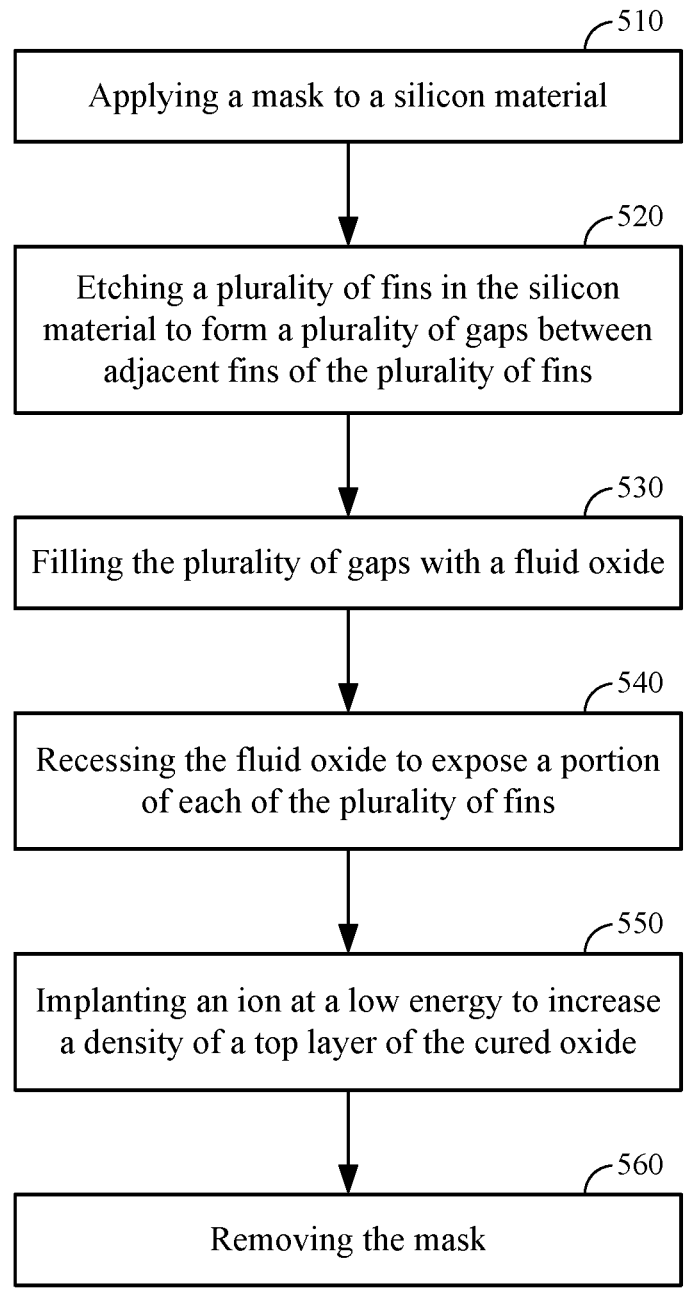
FIG. 5 illustrates a partial method for manufacturing a finFET in accordance with some examples of the disclosure.

FIG. 5 illustrates a partial method for manufacturing a finFET in accordance with some examples of the disclosure. As shown in FIG. 5, the partial method begins in block 510 with applying a mask (e.g. mask 112) to a silicon material (e.g. silicon substrate 110). Next, the partial method continues in block 520 with etching a plurality of fins (e.g. first fin 130, second fin 132, and third fin 134) in the silicon material to form a plurality of gaps (e.g. first gap 150 and second gap 152) between adjacent fins of the plurality of fins. Next, the partial method continues in block 530 with filling the plurality of gaps with a fluid oxide (e.g. oxide material 120). Next, the partial method continues in block 540 with recessing the fluid oxide to expose a portion of each of the plurality of fins. Next, the partial method continues in block 550 with implanting an ion at a low energy to increase a density of a top layer (e.g. top layer 124) of the cured oxide above a bottom layer (e.g. bottom layer 122). Next, the partial method concludes in block 560 with removing the mask. The fluid oxide may be silicon dioxide, for example. The mask may be a hardmask of silicon nitride, for example. The ions may be silicon ions, carbon ions, nitrogen ions, fluorine ions, or helium ions, for example.

Figure 6:
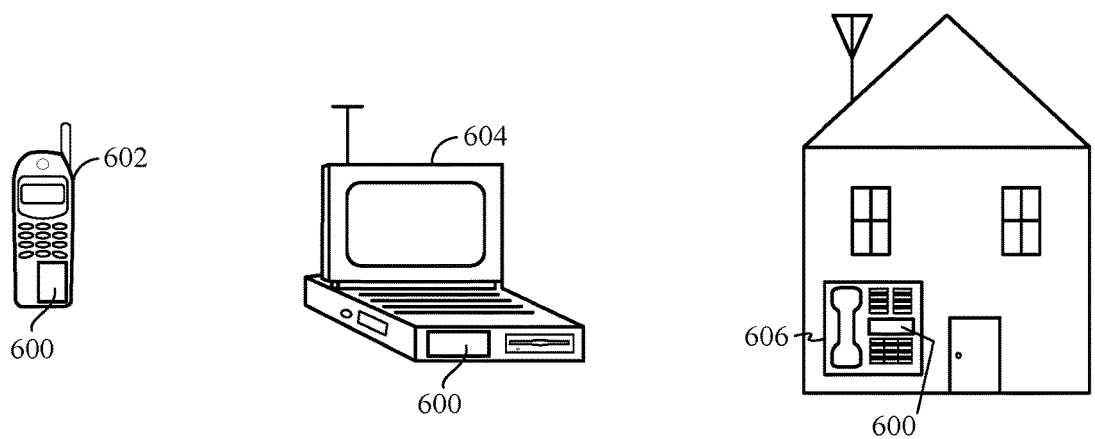
FIG. 6 illustrates various electronic devices that may be integrated with any of the aforementioned integrated device, semiconductor device, integrated circuit, die, interposer, package or package-on-package (PoP) in accordance with some examples of the disclosure.

FIG. 6 illustrates various electronic devices that may be integrated with any of the aforementioned integrated device, semiconductor device, integrated circuit, die, interposer, package or package-on-package (PoP) in accordance with some examples of the disclosure. For example, a mobile phone device 602, a laptop computer device 604, and a fixed location terminal device 606 may include an integrated device 600 as described herein. The integrated device 600 may be, for example, any of the integrated circuits, dies, integrated devices, integrated device packages, integrated circuit devices, device packages, integrated circuit (IC) packages, package-on-package devices described herein. The devices 602, 604, 606 illustrated in FIG. 6 are merely exemplary. Other electronic devices may also feature the integrated device 600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

One or more of the components, processes, features, and/or functions illustrated in FIGS. 1-6 may be rearranged and/or combined into a single component, process, feature or function or incorporated in several components, processes, or functions. Additional elements, components, processes, and/or functions may also be added without departing from the disclosure. It should also be noted that FIGS. 1-6 and its corresponding description in the present disclosure is not limited to dies and/or ICs. In some implementations, FIGS. 1-6 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device.

In the detailed description above it can be seen that different features are grouped together in examples. This manner of disclosure should not be understood as an intention that the claimed examples have more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:
1. A finFET comprising:
   a plurality of fins separated from each other to form a plurality of gaps between adjacent fins of the plurality of fins;

an oxide material located in the plurality of gaps, the oxide material directly contacts the adjacent fins of the plurality of fins with a first density proximate to a top layer of the oxide material and a second density proximate to a bottom layer of the oxide material; and wherein the first density is greater than the second density.

2. The finFET of claim 1, wherein the oxide material has a first ion concentration near the top layer of the oxide material that is greater than a second ion concentration near the bottom layer of the oxide material.

3. The finFET of claim 2, wherein ions of the first ion concentration are one of a silicon ions, carbon ions, nitrogen ions, fluorine ions, or helium ions.

4. The finFET of claim 1, further comprising a plurality of gate structures, one of the plurality of gate structures surrounding each of the plurality of fins, and wherein a portion of the oxide material is located under each of the plurality of gate structures.

5. The finFET of claim 4, further comprising:
a source proximate to the plurality of gate structures; and
a drain proximate to the plurality of gate structures opposite the source.

6. The finFET of claim 1, wherein the finFET is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

7. A finFET comprising:
a silicon substrate;
a plurality of fins on a surface of the silicon substrate;
an oxide material on the surface of the silicon substrate, the oxide material located between each of the plurality of fins and directly contacts the plurality of fins, wherein the oxide material has a first density that directly contacts the plurality of fins and a second density that directly contacts the plurality of fins, the second density is lesser than the first density; and
a plurality of gate structures, each of the plurality of gate structures located on the oxide material and surrounds a respective one of the plurality of fins.

8. The finFET of claim 7, wherein the oxide material has a first ion concentration proximate to the plurality of gate structures that is greater than a second ion concentration proximate to the silicon substrate.

9. The finFET of claim 8, wherein ions of the first ion concentration are one of a silicon ions, carbon ions, nitrogen ions, fluorine ions, or helium ions.

10. The finFET of claim 9, further comprising:
a source proximate to the plurality of gate structures; and
a drain proximate to the plurality of gate structures opposite the source.

11. The finFET of claim 10, wherein the finFET is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

12. A finFET comprising:
first means for conducting current;
second means for conducting current separated from the first means for conducting current to form a gap between the first means for conducting current and the second means for conducting current;
means for isolation located in the gap and on each side of both the first means for conducting current and the second means for conducting current, the means for isolation directly contacts the first means for conducting current and the second means for conducting current with a first density proximate to a top layer of the means for isolation and a second density proximate to a bottom layer of the means for isolation; and
wherein the first density is greater than the second density.

13. The finFET of claim 12, wherein the means for isolation has a first ion concentration near the top layer of the means for isolation that is greater than a second ion concentration near the bottom layer of the means for isolation.

14. The finFET of claim 13, wherein ions of the first ion concentration are one of a silicon ions, carbon ions, nitrogen ions, fluorine ions, or helium ions.

15. The finFET of claim 12, further comprising a plurality of gate structures, one of the plurality of gate structures surrounding each of the first means for conducting current and the second means for conducting current, and wherein a portion of the means for isolation is located under each of the plurality of gate structures.

16. The finFET of claim 15, further comprising:
a source proximate to the plurality of gate structures; and
a drain proximate to the plurality of gate structures opposite the source.

17. The finFET of claim 12, wherein the finFET is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

* * * * *